United States Patent
Zhan et al.

(10) Patent No.: US 9,287,856 B2
(45) Date of Patent: Mar. 15, 2016

(54) TRACKING CIRCUIT

(75) Inventors: Hao-Jie Zhan, Hsinchu (TW); Tsung-Hsin Yu, Jhudong Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 919 days.

(21) Appl. No.: 13/302,404

(22) Filed: Nov. 22, 2011

(65) Prior Publication Data

US 2013/0127520 A1    May 23, 2013

(51) Int. Cl.
*B23K 11/24* (2006.01)
*H03K 3/356* (2006.01)
*H03K 19/0185* (2006.01)

(52) U.S. Cl.
CPC .. *H03K 3/356104* (2013.01); *H03K 19/018521* (2013.01)

(58) Field of Classification Search
CPC ................. H03K 19/018521; H03K 3/356104
USPC ........................................................ 307/112
See application file for complete search history.

(56) References Cited

U.S. PATENT DOCUMENTS

| | | | | |
|---|---|---|---|---|
| 4,857,764 A | * | 8/1989 | Young | 326/86 |
| 7,589,561 B1 | * | 9/2009 | Chan et al. | 326/80 |
| 2009/0102431 A1 | * | 4/2009 | Kung et al. | 320/162 |
| 2010/0308891 A1 | | 12/2010 | von Kaenel | |
| 2011/0175668 A1 | * | 7/2011 | Von Kaenel | 327/403 |
| 2012/0280744 A1 | * | 11/2012 | Hsieh | 327/536 |

FOREIGN PATENT DOCUMENTS

CN        101257297        9/2008

\* cited by examiner

*Primary Examiner* — Jared Fureman
*Assistant Examiner* — Duc M Pham
(74) *Attorney, Agent, or Firm* — Hauptman Ham, LLP

(57) ABSTRACT

A circuit includes a switching circuit, a node, and a tracking circuit. The switching circuit has a first terminal, a second terminal, and a third terminal. The node has a node voltage. The tracking circuit is electrically coupled to the third terminal and the node, and configured to receive the node voltage and generate a control voltage at the third terminal based on the node voltage.

20 Claims, 6 Drawing Sheets

TRACKING CIRCUIT

FIELD

The present disclosure is related to a tracking circuit.

BACKGROUND

In a circuit, 3.3 V transistors under a 3.3 V environment are used. The circuit charges a universal serial bus (USB) when the USB is idle and has a voltage value of 0 V, for example. The USB, on the other hand, has a voltage value of 5 V in an operational mode. In addition, a special native NMOS transistor is designed to handle the 5 V of the USB in the 3.3 V environment. A native transistor is a transistor having a 0 V threshold voltage value.

As the size of transistors shrinks in line with the advent of process technology nodes, operational voltages for the transistors have decreased. In some applications, 3.3 V transistors are not suitable.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
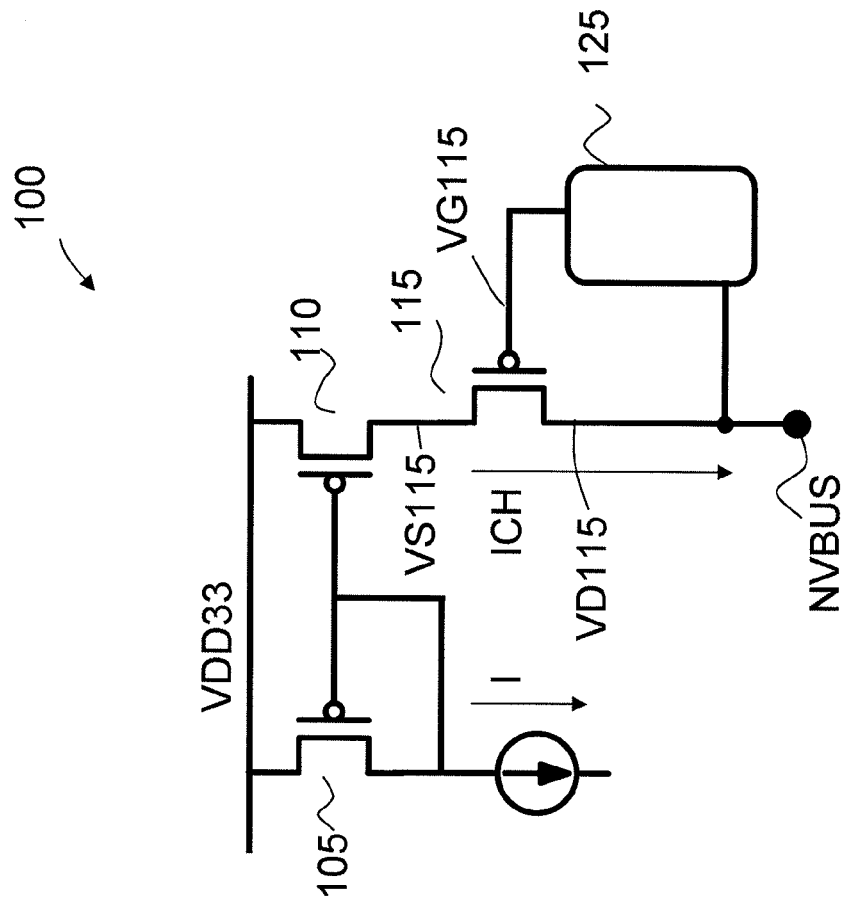
FIG. 1 is a diagram of a charging circuit in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. A tracking circuit is configured to generate different output voltage values based on different input voltage values of a universal serial bus (USB). For example, the tracking circuit generates 1.8 V at the output when the bus is at 0 V. In contrast, the tracking circuit generates 5.0 V when the bus is at 5.0 V. In some embodiments, the USB is electrically connected to a drain of a transistor. Effectively, the input voltage of the tracking circuit is at the drain of the transistor. Further, the output voltage is at the gate of the transistor. Because the tracking circuit controls the voltage at the gate of the transistor, voltages VGD and VGS of the transistor are within an acceptable range, preventing the transistor from being damaged. Voltage VGD is the voltage dropped between the gate and the drain of the transistor. Voltage VGS is the voltage dropped between the gate and the source of the transistor. In some embodiments, no special transistors such as a native and/or a drain extended transistor are used, which reduces design complexities.

Exemplary Circuit

FIG. 1 is a diagram of a circuit 100, in accordance with some embodiments.

PMOS transistors 105 and 110 function as a current mirror, mirroring current I from current source 110 to generate current ICH. Current ICH flows through transistor 110 and 115 to charge node NVBUS having voltage VBUS (shown in FIG. 2). Node NVBUS is coupled to the drain of transistor 115. In some embodiments, node NVBUS is electrically connected to a universal serial bus (USB). As a result, when node NVBUS is charged, the USB is charged.

For illustration, the voltage at the drain, the source, and the gate of transistor 115 are called voltage VD115, voltage VS115, and voltage VG115, respectively. Voltage VGS115 (not labeled) is the voltage dropped between the gate and the source of transistor 115. Similarly, voltage VGD115 (not labeled) is the voltage dropped between the gate and the drain of transistor 115. Because node NVBUS is coupled to the drain of transistor 115, a reference to voltage VD115 at the drain of transistor 115 also refers to voltage VBUS.

PMOS transistor 115 functions as a current switch. For example, when transistor 115 is on, current ICH flows through transistor 115 and charges node NVBUS. But if transistor 115 is off, node NVBUS is electrically disconnected from the current mirror formed by transistors 105 and 110. Transistor 115 is shown as a PMOS transistor for illustration. A different type of transistor and/or other switching circuits used in place of transistor 115 are within the scope of various embodiments.

In some embodiments, transistors 105, 110, 115, and transistors in circuit 125 are 1.8 V transistors. As a result, in general, the maximum voltage VMAX (not labeled) dropped between the gate and the drain and between the gate and the source of each transistor are about 1.8 V plus some voltage margin. In some embodiments, an exemplary voltage margin is about two hundred milli-volts (200 mV). For illustration, the voltage margin is 0 V, and voltage VMAX is therefore 1.8V. In some embodiments, because transistor 115 is a "regular" 1.8 V transistor, the embodiments are advantageous over other approaches in which a native transistor is used.

In some embodiments, transistors 105 and 110 are configured to receive voltage VDD33 at 3.3 V so that node NVBUS, when charged, is closer to 3.3 V. For example, when circuit 100 is in operation, the voltage at the drain of transistor 110 is at VDD33 or 3.3 V at the source of transistor 110. The voltage at the drain of transistor 110 is also the voltage at the source of transistor 115, or voltage VS115. Effectively, voltage VS115 is at 3.3 V.

Tracking circuit 125 generates voltage VG115 at the gate of transistor 115. In some embodiments, to protect transistor 115 from being damaged, each of voltage VGS115 and voltage VGD115 is controlled to have an acceptable voltage value. For example, based on voltage VG115 generated by tracking circuit 125, the absolute value |VGS115| of voltage VGS115 and the absolute value |VGD115| of voltage VGD115 is less than the absolute value |VMAX| of voltage VMAX.

For another example, in some embodiments, when voltage VBUS is 0 V, circuit 125 operates to generate 1.8 V for voltage VG115. As a result, voltage VGS115 is −1.5 V, and PMOS transistor 115 is turned on to charge node NVBUS. In some embodiments, voltage VBUS is at 0 V when the USB is powered down, the USB is in the idle mode, etc. In some embodiments, when VBUS is at 0 V, voltage VG115 at 1.8 V is used to enable an on-the-go session request protocol (OTG SRP) of the USB.

In contrast, when voltage VBUS is 5 V, circuit 125 generates 5 V for voltage VG115. As a result, voltage VGD115 is 0 V, which is acceptable for transistor 115. Further, voltage VGS115 is 1.7 V, and PMOS transistor 115 is off. In some embodiments, voltage VBUS is at 5 V when the USB is in operation.

Tracking Circuit

Figure 2:
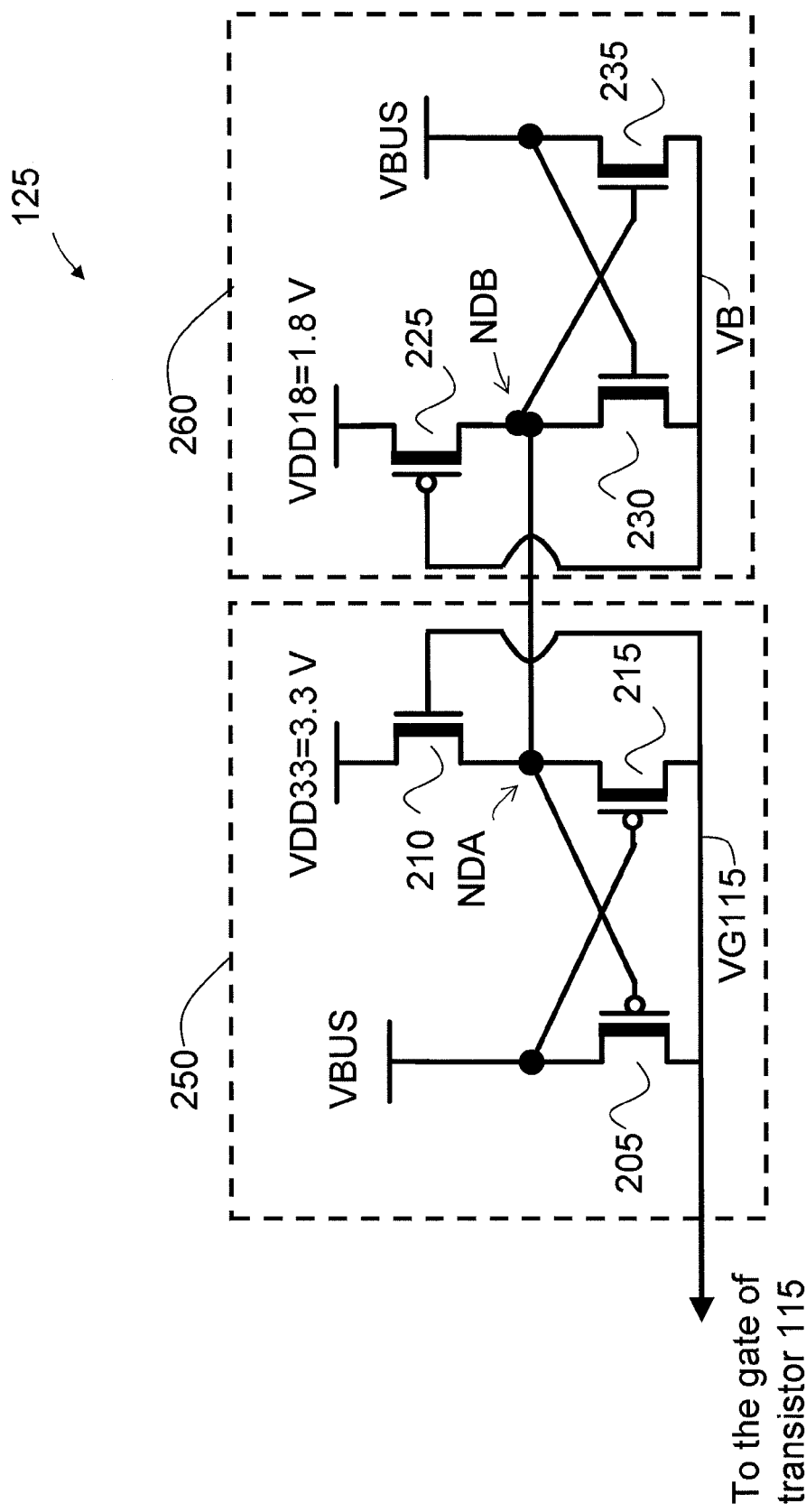
FIG. 2 is a diagram of a tracking circuit of the circuit in FIG. 1, in accordance with some embodiments.

FIG. 2 is a diagram of tracking circuit 125, in accordance with some embodiments. Transistors 205, 210, 215, 225, 230, and 235 are 1.8 V transistors. The threshold voltage for each of PMOS transistors 205, 215, and 225 is about −0.5 V. The threshold voltage for each of NMOS transistors 210, 230, and 235 is about 0.5 V.

The source of PMOS transistor 205 and the drain of NMOS transistor 235 receive voltage VBUS, which, in some embodiments, switches between 0 V and 5.0 V. The drain of NMOS transistor 210 receives voltage VDD33, which, in some embodiments, is 3.3 V. The source of PMOS transistor 225 receives voltage VDD18, which, in some embodiments, is 1.8 V. In some embodiments, the different voltages for the different transistors are selected such that the voltages between the gate and the source and between the gate and the drain of each transistor do not exceed voltage VMAX.

Circuit 125 includes a latch 250 and a latch 260 that function together to provide voltage VG115 to the gate of transistor 115 in FIG. 1, in response to different voltage values of voltage VBUS. In some embodiments, voltage VBUS switches between 0 V and 5 V. For example, voltage VBUS is at 0 V when the USB is in an idle mode, and voltage VBUS is at 5.0 V when the USB is in operation.

In latch 250, node NVG115 (not labeled) has voltage VG115. In some embodiments, node NVG115 is clamped at voltage VDD18 when voltage VBUS is less than voltage VDD18, for example, when voltage VBUS is at 0 V. Node NVG115 is also configured as a VBUS follower. That is, node NVG115 has a voltage value that follows the voltage value of voltage VBUS when voltage VBUS is higher than voltage VDD18. For example, node NVG115 has the value of 5.0 V of voltage VBUS when voltage VBUS is at 5.0 V. Explained differently, the voltage value at node NVG115 tracks the voltage value of voltage VBUS when voltage VBUS is at 5.0 V. As a result, circuit 125 is commonly called a tracking circuit.

The drain of PMOS transistor 205 is coupled to the drain of PMOS transistor 215, the gate of NMOS transistor 210, and the gate of PMOS transistor 115 in FIG. 1. The gate of PMOS transistor 215 is coupled to the source of PMOS transistor 205, and is configured to receive voltage VBUS. The gate of PMOS transistor 205 is coupled to the source of PMOS transistor 215 and the source of NMOS transistor 210 at node NDA. Node NDA is electrically connected to node NDB of latch 260. The drain of NMOS transistor 210 receives voltage VDD33, which, in some embodiments, is 3.3V.

In latch 260, node NDB couples the drain of NMOS transistor 230, the drain of PMOS transistor 225, the gate of NMOS transistor 235, and node NDA. The source of PMOS transistor 225 receives voltage VDD18A, which, in some embodiments, is 1.8 V. The drain of NMOS transistor 235 is coupled to the gate of NMOS transistor 230, and is configured to receive voltage VBUS. The sources of NMOS transistors 230 and 235 are coupled together at node NVB (not labeled) having voltage VB. Node NVB is coupled to the gate of PMOS transistor 225.

Operation of Tracking Circuit when VBUS is 0 V

Figure 3:
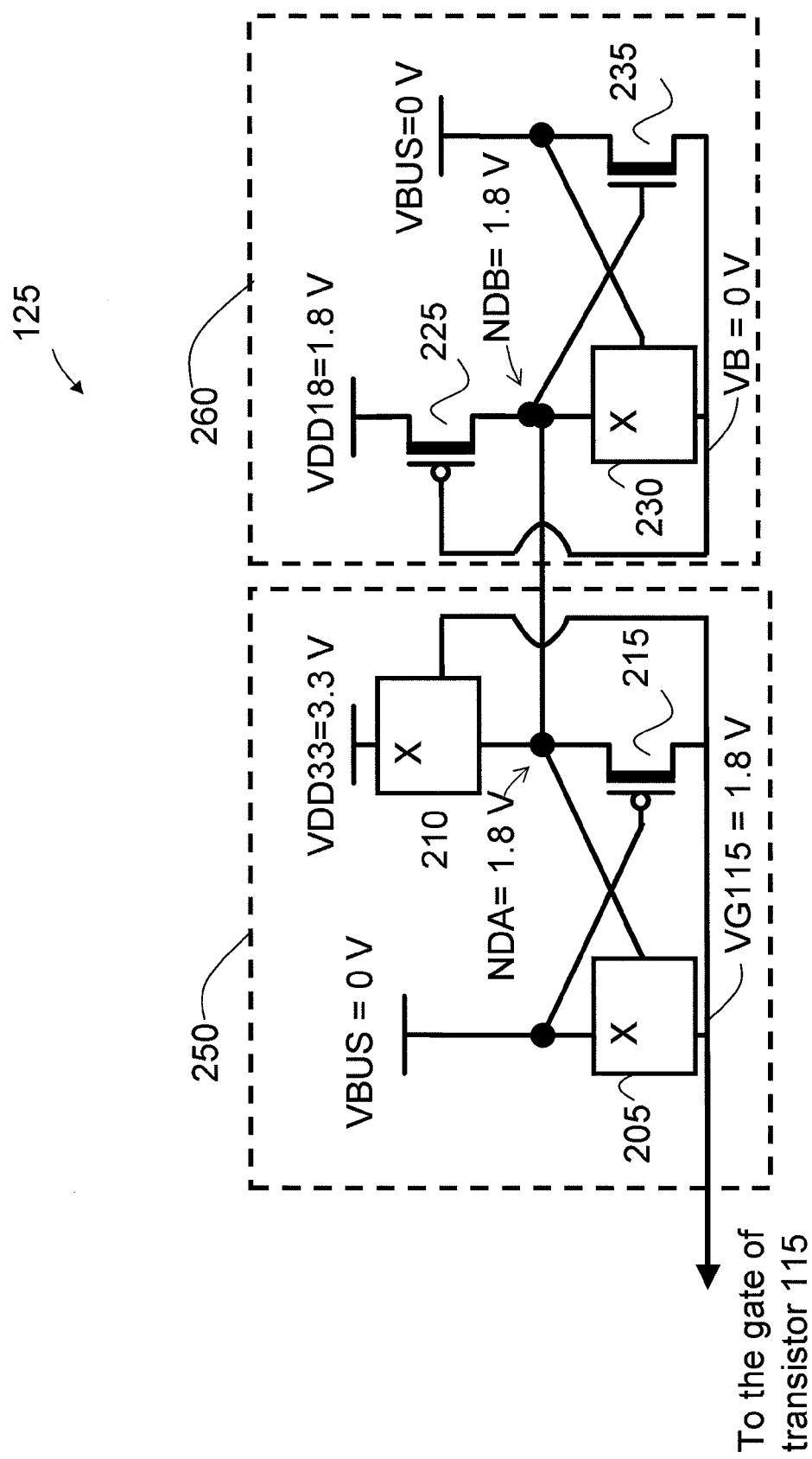
FIG. 3 is a diagram of the tracking circuit having voltage values for various nodes when a voltage of a bus is at a first voltage value, in accordance with some embodiments.

FIG. 3 is a diagram of circuit 125 having voltage values of various nodes in circuit 125, in response to voltage VBUS having 0 V, in accordance with some embodiments. For illustration, each of transistors 205, 210, and 230 is marked with an X because the transistors are off as illustratively detailed below.

With reference to latch 260, for analysis purposes, assume PMOS transistor 225 is on. As a result, the drain of transistor 225 or node NDB is at voltage VDD18 or 1.8 V at the source of transistor 225. Node NDB is also the gate of NMOS transistor 235. Effectively, the gate of NMOS transistor 235 is at 1.8 V. When VBUS is 0 V, the voltage at the gate of NMOS transistor 230 is 0 V. Consequently, the voltage at the gate of NMOS transistor 235 is higher than the voltage at the gate of NMOS transistor 230. NMOS transistor 235 is therefore on and NMOS transistor 230 is off. The off-transistor 230 is marked with an X.

Because NMOS transistor 235 is on, voltage VB at the source of transistor 235 is pulled to the voltage at the drain of transistor 235 or voltage VBUS or 0 V. Voltage VB is also the voltage at the gate of PMOS transistor 225. As a result, the voltage dropped between the gate and the source of PMOS transistor 225 is −1.8 V. PMOS transistor 225 is therefore on, confirming the above assumption that PMOS transistor 225 is on. Further, the voltage dropped across the gate and the source of NMOS transistor 230 is 0 V, which confirms that NMOS transistor 230 is off.

With reference to latch 250, for analysis purposes, assume NMOS transistor 210 is off and has no electrical effect on node NDA. As a result, node NDA has a value of 1.8 V from node NDB. Effectively, the voltage at the gate of PMOS transistor 205 is 1.8 V. Voltage VBUS being 0 V is also the voltage at the gate of PMOS transistor 215. Because the voltage at the gate of PMOS transistor 215 is lower than the voltage at the gate of PMOS transistor 205, PMOS transistor 215 is on and PMOS transistor 205 is off. The off-transistor 205 is marked with an X.

Because transistor 215 is on, the voltage at the drain of PMOS transistor 215 is pulled to the voltage at the source of PMOS transistor 215 or 1.8 V. The voltage dropped across the gate and the source of PMOS transistor 215 is −1.8 V, which confirms that PMOS transistor 215 is on. The voltage at the drain of PMOS transistor 215 at 1.8 V is also voltage VG115, which is also the voltage at the gate of NMOS transistor 210. As a result, the voltage dropped across the gate and the source of NMOS transistor 210 is 0 V, which confirms that NMOS transistor 210 is off. The off-transistor 210 is marked with an X.

Because voltage VG115 at the gate of transistor 115 in FIG. 1 is 1.8 V and voltage VD115 at the drain of transistor 115 is voltage VBUS or 0 V, voltage VGD115 of transistor 115 is 1.8 V, and is acceptable. Further, voltage VGS115 of PMOS transistor 115 is −1.5 V, which turns on PMOS transistor 115 to charge node NVBUS.

Operation of Tracking Circuit when VBUS is 5 V

Figure 4:
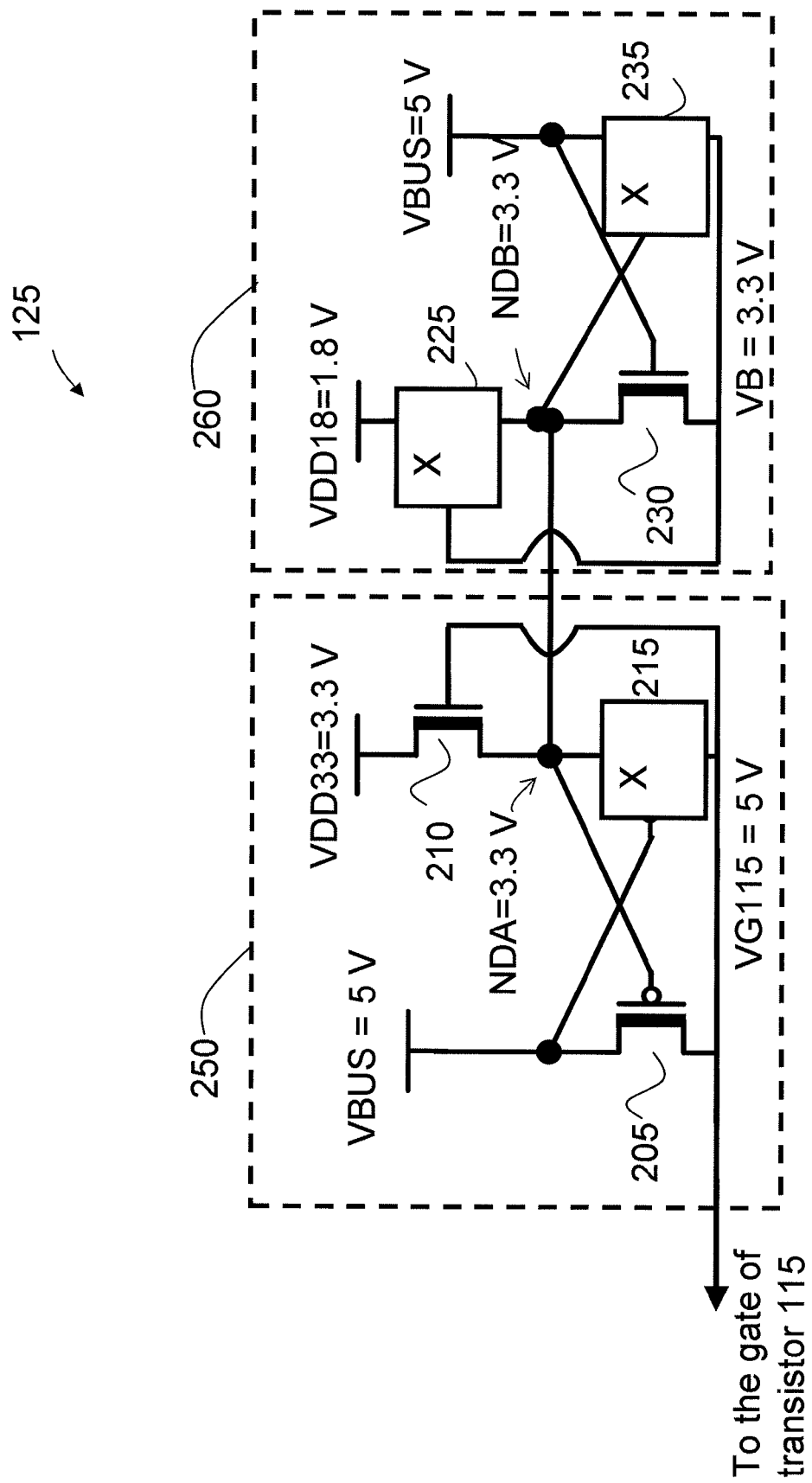
FIG. 4 is a diagram of the tracking circuit having voltage values for various nodes when a voltage of a bus is at a second voltage value, in accordance with some embodiments.

FIG. 4 is a diagram of circuit 125 having voltage values of various nodes in circuit 125, in response to voltage VBUS being 5 V, in accordance with some embodiments. For illustration, each of transistors 215, 225, and 235 is marked with an X because the transistors are off as illustratively detailed below.

With reference to latch 250, for analysis purposes, assume NMOS transistor 210 is on. As a result, the source of NMOS transistor 210 or node NDA is at voltage VDD33 or 3.3 V at the drain of transistor 210. Node NDA is also the gate of PMOS transistor 205. Effectively, the gate of PMOS transistor 205 is at 3.3 V. When VBUS is 5 V, the voltage at the gate of PMOS transistor 215 is 5 V. Consequently, the voltage at the gate of PMOS transistor 205 is lower than the voltage at the gate of PMOS transistor 215. PMOS transistor 205 is therefore on and PMOS transistor 215 is off. The off-transistor 215 is marked with an X.

Because PMOS transistor 205 is on, voltage VG115 at the drain of transistor 205 is pulled to the voltage at the source of transistor 205 or VBUS or 5 V. Voltage VG115 is also the voltage at the gate of NMOS transistor 210. As a result, the voltage dropped across the gate and the source of NMOS transistor 210 is 1.7 V. NMOS transistor 210 is therefore on, confirming the above assumption that transistor 210 is on. Further, the voltage dropped across the gate and the source of transistor 215 is 1.7 V, which confirms that PMOS transistor 215 is off.

With reference to latch 260, for analysis purposes, assume PMOS transistor 225 is off and has no electrically effect on node NDB. As a result, node NDB has a value of 3.3 V from node NDA. Effectively, the voltage at the gate of NMOS transistor 235 is 3.3 V. Voltage VBUS being 5 V is also the voltage at the gate of NMOS transistor 230. Because the voltage at the gate of NMOS transistor 235 is lower than the voltage at the gate of NMOS transistor 230, NMOS transistor 230 is on and NMOS transistor 235 is off. The off-transistor 235 is marked with an X.

Because transistor 230 is on, the voltage at the source of NMOS transistor 230 is pulled to the voltage at the drain of NMOS transistor 230 or 3.3 V. The voltage dropped across the gate and the source of NMOS transistor 230 is 1.7 V, which confirms that NMOS transistor 230 is on. The voltage at the source of NMOS transistor 230 at 3.3 V is also voltage VB, which is also the voltage at the gate of PMOS transistor 225. The voltage dropped across the gate and the source of PMOS transistor 225 is 1.5 V, which confirms that PMOS transistor 225 is off. The off-transistor 225 is marked with an X.

With reference to FIG. 1, voltage VG115 at the gate of transistor 115 is 5.0 V and voltage VD115 at the drain of transistor 115 is voltage VBUS or 5.0 V. As a result, voltage VGD115 of transistor 115 is 0 V, and is acceptable. Further, voltage VGS of PMOS transistor 115 is 1.7 V, which turns off PMOS transistor 115. Consequently, node NVBUS is electrically disconnected from the current mirror formed by transistors 105 and 110.

In FIGS. 1-4, the voltage values 5.0 V, 3.3 V, and 1.8 V at different nodes are used for illustration. The voltage value of 1.8 V is the nominal operational voltage for the transistors in circuit 100. The voltage value of 3.3 V is about 2 times of 1.8 V plus some negative voltage margin. Similarly, the voltage value of 5.0 V is about 3 times of 1.8 V plus some negative voltage margins. For illustration, the voltage margin is 0 V. In various embodiments, if the nominal operational voltage of the transistors is called Vnom, a voltage value of about 2 times the value of voltage Vnom is used where the voltage value of 3.3. V is applied at a node in FIGS. 1-4. Similarly, a voltage value of about 3 times the voltage value of voltage Vnom is used where the voltage value at the nodes in FIGS. 1-4 is 5.0 V.

Exemplary Method of Peration of Circuit 100

Figure 5:
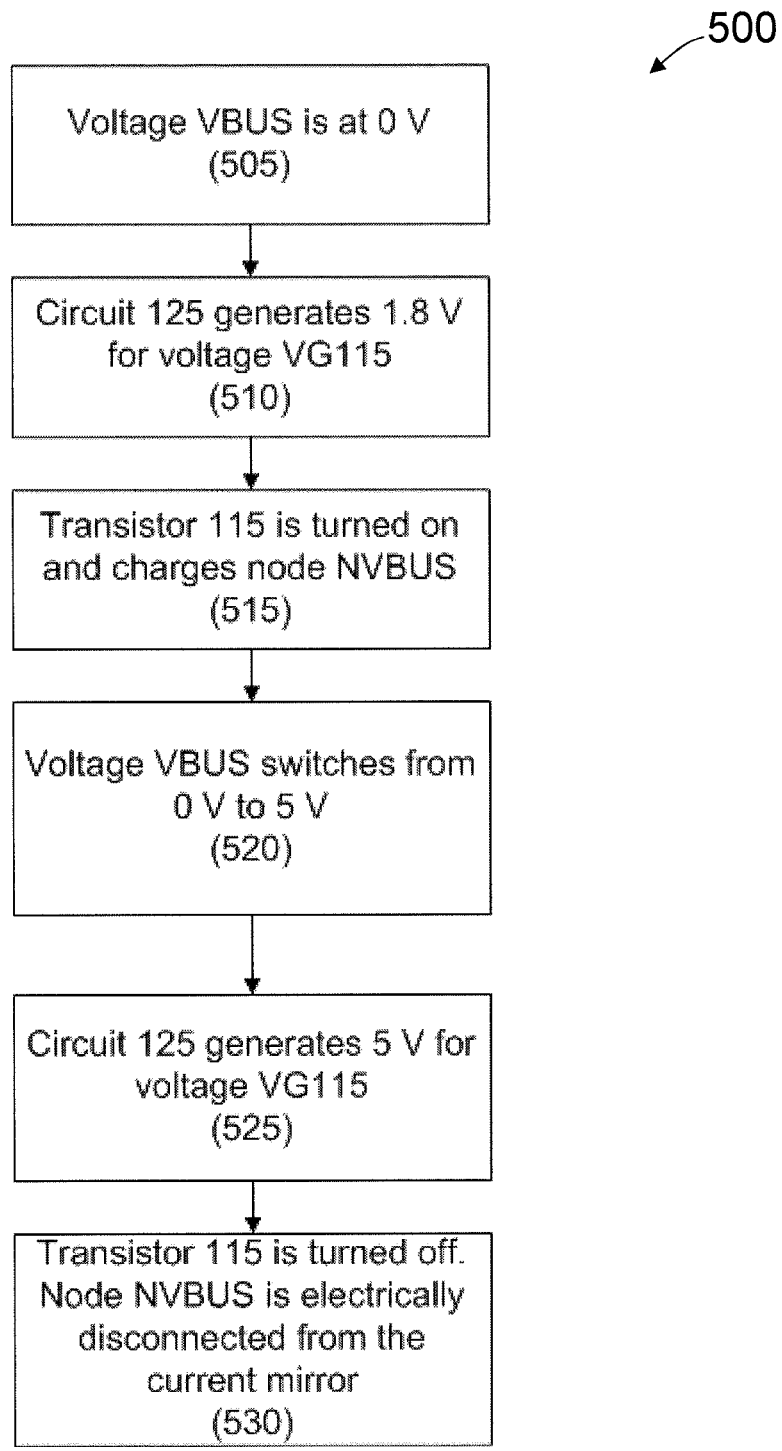
FIG. 5 is a flow chart of a method illustrating an operation of the charging circuit in FIG. 1, in accordance with some embodiments.

FIG. 5 is a flowchart of a method 500 illustrating an operation of circuit 100, in accordance with some embodiments. For illustration, voltage VBUS is initially at 0 V then switches to 5 V.

In step 505, voltage VBUS is at 0 V.

In response, circuit 125, in step 510, generates 1.8 V for voltage VG115.

As a result, transistor 115 is turned on in step 515 and charges node NVBUS.

In step 520, voltage VBUS switches from 0 V to 5 V.

In response, circuit 125, in step 525, generates 5.0 V for voltage VG115.

As a result, transistor 115 is turned off in step 530. Node NVBUS is electrically disconnected from the current mirror formed by transistors 105 and 110.

Exemplary Method of Operation of Circuit 125

Figure 6:
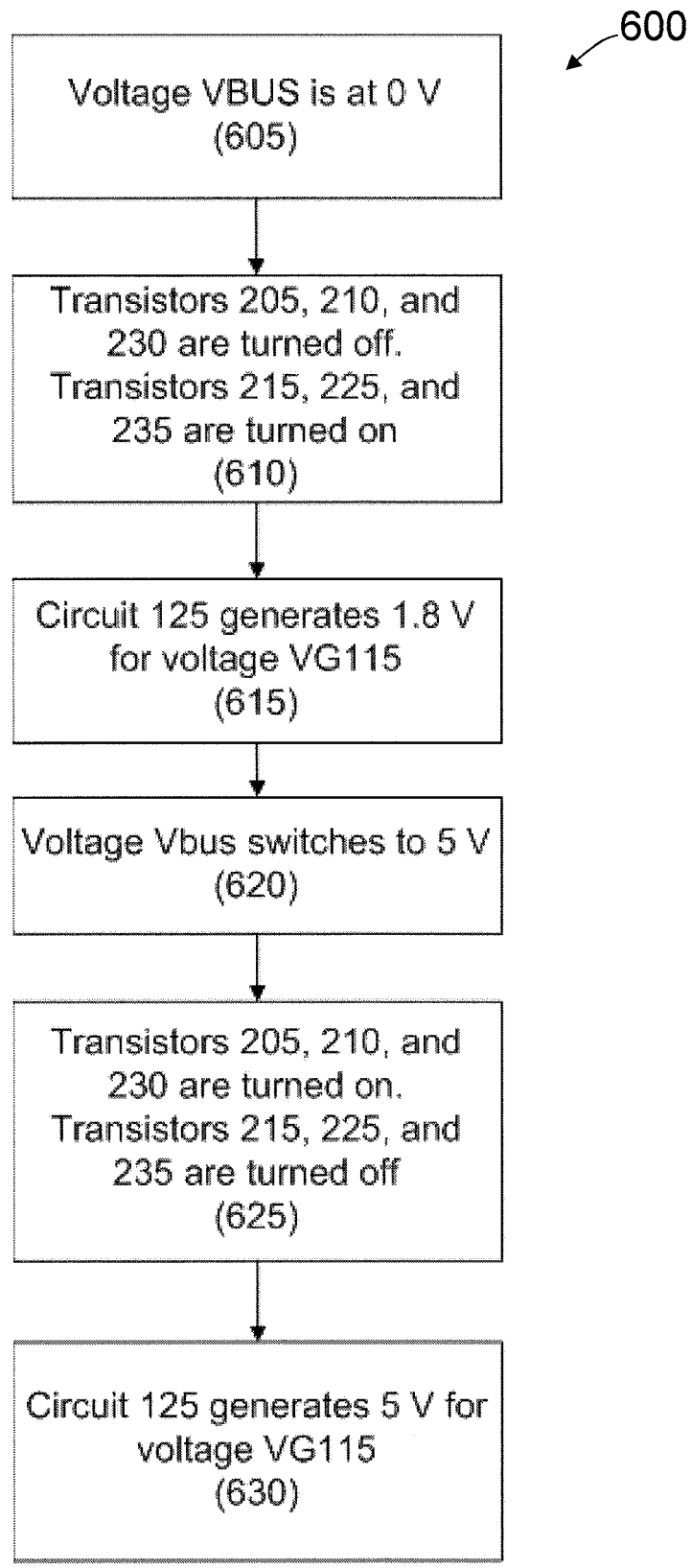
FIG. 6 is a flowchart of a method illustrating an operation of the tracking circuit in FIG. 2, in accordance with some embodiments.

FIG. 6 is a flowchart of a method 600 illustrating an operation of tracking circuit 125, in accordance with some embodiments. For illustration, voltage VBUS is initially at 0 V, then switches to 5 V.

In operation 605, voltage VBUS is at 0 V.

As a result, in operation 610, transistors 205, 210, and 230 are turned off, and transistors 215, 225, and 235 are turned on.

In operation 615, circuit 125 generates 1.8 V for voltage VG115.

In operation 620, voltage VBUS switches from 0 V to 5.0 V.

As a result, in operation 625, transistors 205, 210, and 230 are turned on, and transistors 215, 225, and 235 are turned off.

In operation 630, circuit 125 generates 5 V for voltage VG115.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments.

In some embodiments, a circuit comprises a switching circuit, a node, and a tracking circuit. The switching circuit has a first terminal, a second terminal, and a third terminal. The node has a node voltage. The tracking circuit is electrically coupled to the third terminal and the node, and configured to receive the node voltage and generate a control voltage at the third terminal based on the node voltage.

In some embodiments, a switching circuit having a first terminal, a second terminal, and a third terminal is utilized. The first terminal is caused to have a first voltage value of the first terminal if the second terminal is at a first voltage value of the second terminal. The first terminal is caused to have a second voltage value of the first terminal if the second terminal is at a second voltage value of the second terminal. The third terminal has a voltage value greater than the first voltage value of the first terminal. The first voltage value of the second terminal is less than the first voltage value of the first terminal. The second voltage value of the second terminal is greater than the voltage value of the third terminal.

In some embodiments, a circuit comprises a first PMOS transistor, a second PMOS transistor, a third PMOS transistor, a first NMOS transistor, a second NMOS transistor, and a third NMOS transistor. The first PMOS transistor has a first P drain, a first P source, and a first P gate. The second PMOS transistor has a second P drain, a second P source, and a second P gate. The third PMOS transistor has a third P drain, a third P source, and a third P gate. The first NMOS transistor has a first N drain, a first N source, and a first N gate. The second NMOS transistor has a second N drain, a second N source, and a second N gate. The third NMOS transistor has a third N drain, a third N source, and a third N gate. The first P source is coupled to the second P gate and configured to receive a first voltage. The second P source is coupled to the first P gate and the third N source at a first node. The first P drain is coupled to the second P drain and the third N gate at an output node. The third N drain is configured to receive a first voltage value. The first N drain is coupled to the second N gate and configured to receive the first voltage. The second N drain is coupled to the first N gate and the third P drain at a second node. The first N source is coupled to the second N source and the third P gate. The third P source is configured to receive a second voltage value. The first node is electrically connected to the second node. The second voltage value is less than the first voltage value. The first voltage is configured to switch between a third voltage value less than the second voltage value and a fourth voltage value greater than the third voltage value.

In some embodiments, a circuit comprises a first latching circuit and a second latching circuit. The first latching circuit is configured to receive a first voltage and a second voltage having a second voltage value, and generate an output voltage having an output voltage value at an output node. The first voltage has a first reference voltage value and a second reference voltage value. The second latching circuit is coupled to the first latching circuit at a common node and configured to receive the first voltage and a third voltage having a third voltage value. The first latching circuit is configured to have the output voltage at the third voltage value of the third voltage or to have the output voltage at the second reference voltage value of the first voltage. The third voltage value is less than the second voltage value.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a switching circuit having a first terminal, a second terminal, and a third terminal, the first terminal configured to have a supply voltage value;
a node electrically coupled with the second terminal of the switching circuit, the node having a node voltage, the node voltage having a first voltage value higher than the supply voltage value; and
a tracking circuit electrically coupled to the third terminal of the switching circuit and the node, and configured to selectively turn on or turn off the switching circuit by generating a control voltage at the third terminal of the switching circuit based on the node voltage.

2. The circuit of claim 1 further comprising a current mirror configured to generate a current flowing through the first terminal and the second terminal.

3. The circuit of claim 1, wherein
the tracking circuit is configured to generate a first control voltage value of the control voltage when the node voltage is at a second voltage value different from the first voltage value; and
the tracking circuit is configured to generate a second control voltage value of the control voltage when the node voltage is at the first voltage value.

4. The circuit of claim 3, wherein
the first control voltage value is higher than the second voltage value; and
the second control voltage value is about the first voltage value.

5. The circuit of claim 3, wherein
the second voltage value is less than the supply voltage value;
the first voltage value is higher than the supply voltage value;
the first control voltage value is between the second voltage value and the supply voltage value; and
the second control voltage value is about the first voltage value.

6. The circuit of claim 1, wherein the tracking circuit includes
a first latching circuit configured to receive the node voltage and a second voltage having a second voltage value and generate an output voltage having an output voltage value at the third terminal, the node voltage having a first reference voltage value and the first voltage value; and
a second latching circuit coupled to the first latching circuit at a common node and configured to receive the node voltage and a first voltage having a third voltage value, wherein
the first latching circuit is configured to have the output voltage at the third voltage value of the first voltage or to have the output voltage at the first voltage value of the node voltage; and
the third voltage value is less than the second voltage value.

7. The circuit of claim 1, wherein
the switching circuit includes a PMOS transistor, the first terminal is a source of the PMOS transistor, the second terminal is a drain of the PMOS transistor, and the third terminal is a gate of the PMOS transistor.

8. The circuit of claim 1, wherein the node is electrically coupled to a data bus.

9. A method comprising:
utilizing a switching circuit having a first terminal, a second terminal, and a third terminal, the first terminal being a control terminal;
causing, by a tracking circuit coupled with the first terminal and the second terminal, the first terminal to have a first voltage value of the first terminal sufficient to turn on the switching circuit if the second terminal is at a first voltage value of the second terminal; and
causing, by the tracking circuit, the first terminal to have a second voltage value of the first terminal sufficient to turn off the switching circuit if the second terminal is at a second voltage value of the second terminal,
wherein
the third terminal has a voltage value greater than the first voltage value of the first terminal;
the first voltage value of the second terminal is less than the voltage value of the third terminal; and
the second voltage value of the second terminal is greater than the voltage value of the third terminal.

10. The method of claim 9, wherein
the switching circuit includes a PMOS transistor;
the first terminal is a gate of the PMOS transistor;
the second terminal is a drain of the PMOS transistor; and
the third terminal is a source of the PMOS transistor.

11. The method of claim 9, wherein the second terminal is electrically connected to a data bus and/or the third terminal is electrically coupled to a current mirror.

12. A circuit comprising:
a first PMOS transistor having a first P drain, a first P source, and a first P gate;
a second PMOS transistor having a second P drain, a second P source, and a second P gate;
a third PMOS transistor having a third P drain, a third P source, and a third P gate;
a first NMOS transistor having a first N drain, a first N source, and a first N gate;
a second NMOS transistor having a second N drain, a second N source, and a second N gate; and
a third NMOS transistor having a third N drain, a third N source, and a third N gate,
wherein
the first P source is coupled to the second P gate and configured to receive a first voltage;
the second P source is coupled to the first P gate and the third N source at a first node;
the first P drain is coupled to the second P drain and the third N gate at an output node;
the third N drain is configured to receive a first voltage value;
the first N drain is coupled to the second N gate and configured to receive the first voltage;
the second N drain is coupled to the first N gate and the third P drain at a second node;
the first N source is coupled to the second N source and the third P gate;
the third P source is configured to receive a second voltage value;
the first node is electrically connected to the second node;
the second voltage value is less than the first voltage value; and
the first voltage is configured to switch between a third voltage value less than the second voltage value and a fourth voltage value greater than the third voltage value.

13. The circuit of claim 12, wherein the output is configured to control a switching circuit.

14. The circuit of claim 12, wherein
when the first voltage is at the third voltage value
the first PMOS transistor, the third NMOS transistor, and the second NMOS transistor are configured to be off; and
the second PMOS transistor, the third PMOS transistor, and the first NMOS transistor are configured to be on; and
when the first voltage is at the fourth voltage value
the first PMOS transistor, the third NMOS transistor, and the second NMOS transistor are configured to be on; and
the second PMOS transistor, the third PMOS transistor, and the first NMOS transistor are configured to be off.

15. A circuit comprising:
a first latching circuit configured to receive a first voltage and a second voltage having a second voltage value and generate an output voltage having an output voltage value at an output node, the first voltage having a first reference voltage value and a second reference voltage value; and
a second latching circuit coupled to the first latching circuit at a common node and configured to receive the first voltage and a third voltage having a third voltage value,
wherein
the first latching circuit is configured to have the output voltage at the third voltage value of the third voltage or to have the output voltage at the second reference voltage value of the first voltage; and
the third voltage value is less than the second voltage value.

16. The circuit of claim 15, wherein
the first latching circuit is configured to have the output voltage at the third voltage value when the first voltage is at the first reference voltage value; and
the first latching circuit is configured to have the output voltage at the second reference voltage value when the first voltage is at the second reference voltage value.

17. The circuit of claim 15, wherein
the first latching circuit includes
a first PMOS transistor having a first P drain, a first P source, and a first P gate;
a second PMOS transistor having a second P drain, a second P source, and a second P gate; and
a third NMOS transistor having a third N drain, a third N source, and a third N gate,
wherein
the first P source is coupled to the second P gate and configured to receive a first voltage;
the second P source is coupled to the first P gate and the third N source at a first node;
the first P drain is coupled to the second P drain and the third N gate at an output node; and
the third N drain is configured to receive a first voltage value; and
the second latching circuit includes
a first NMOS transistor having a first N drain, a first N source, and a first N gate;
a second NMOS transistor having a second N drain, a second N source, and a second N gate; and
a third PMOS transistor having a third P drain, a third P source, and a third P gate,
wherein
the first N drain is coupled to the second N gate and configured to receive the first voltage;
the second N drain is coupled to the first N gate and the third P drain at a second node;
the first N source is coupled to the second N source and the third P gate; and
the third P source is configured to receive a second voltage value.

18. The circuit of claim 17, wherein
in a first operational mode, the circuit is configured such that the second PMOS transistor, the third PMOS transistor, and the first NMOS transistor are on and the first PMOS transistor, the third NMOS transistor, and the second NMOS transistor are off, when the first voltage has the first reference voltage value; and
in a second operational mode, the circuit is configured such that the second PMOS transistor, the third PMOS transistor, and the first NMOS transistor are off and the first PMOS transistor, the third NMOS transistor, and the second NMOS transistor are on, when the first voltage has the second reference voltage value.

19. The circuit of claim 15, wherein the output node is configured to control a switching circuit.

20. The circuit of claim 15, wherein
the second voltage value and a first voltage margin are about two times a nominal operational voltage value of transistors in the first and/or the second latching circuit; and
the third voltage value and a second voltage margin are about the nominal operational voltage value.

* * * * *